United States Patent [19]

Kishi

[11] Patent Number: 4,686,321
[45] Date of Patent: Aug. 11, 1987

[54] PHOTOVOLTAIC DEVICE AND METHOD OF MANUFACTURING THEREOF

[75] Inventor: Yasuo Kishi, Osaka, Japan

[73] Assignee: Sanyo Electric Co., Ltd., Japan

[21] Appl. No.: 878,118

[22] Filed: Jun. 25, 1986

[30] Foreign Application Priority Data

Jul. 2, 1985 [JP] Japan .................................. 60-145364

[51] Int. Cl.[4] ........................ H01L 25/02; H01L 31/18
[52] U.S. Cl. ..................................... 136/244; 136/251; 156/212; 156/285; 437/2; 437/216; 437/212
[58] Field of Search ........................ 136/244, 245, 251; 29/572, 581, 588, 589; 156/212, 285, 286

[56] References Cited

U.S. PATENT DOCUMENTS 3,565,719  2/1971  Webb ................................ 156/212
4,064,521 12/1977  Carlson ................................ 357/2
4,281,208  7/1981  Kuwano et al. ..................... 136/249
4,571,446  2/1986  Yamazaki ........................... 136/244

FOREIGN PATENT DOCUMENTS 52640  4/1985  Japan ................................. 136/244

Primary Examiner—Aaron Weisstuch
Attorney, Agent, or Firm—Darby & Darby

[57] ABSTRACT

A transparent glass substrate 1 having flat surfaces parallel to each other is prepared and a plurality of film-shaped photoelectric conversion elements are formed on one flat surface 1b thereof. After that, the glass substrate 1 is made to face a curved surface 3b of a transparent light receiving plate 3 having a larger mechanical strength than that of the glass substrate 1 with an adhesive sheet being interposed therebetween. Then, the glass substrate 1 and the light receiving plate 3 are kept under a reduced pressure so that the glass substrate 1 is curved along the curved surface 3b by atmospheric pressure and is made to adhere to the curved surface 3b of the light receiving plate 3 through the adhesive sheet.

10 Claims, 5 Drawing Figures

PHOTOVOLTAIC DEVICE AND METHOD OF MANUFACTURING THEREOF

BACKGROUND OF THE INVENTION

1. Field of the Invention

The present invention relates to a photovoltaic device and a method of manufacturing thereof and particularly relates to a photovoltaic device for converting light energy directly to electric energy and a method of manufacturing thereof.

2. Description of the Prior Art

A photovoltaic device for converting light energy directly to electric energy, that is, a so-called solar cell has attracted special interest in view of the problem of exhaustion of energy sources because the so-called solar cell uses mainly inexhaustible sunlight as an energy source. The sun gives an energy of approximately 1 kW/m$^2$ to the surface of the earth when the weather is fair and assuming that the photoelectric conversion efficiency of a solar cell for converting light energy to electric energy is 10% for example, electric power of only 1 W is generated if a solar cell having an effective light receiving area of 10 cm×10 cm is used, and accordingly, a large area solar cell is required.

In order to satisfy such requirement, there has been developed a solar cell as disclosed in U.S. Pat. No. 4,064,521 in which an amorphous silicon film obtained by a plasma CVD method using a silicon compound gas as a raw material gas functions as a photoactive layer for performing photoelectric conversion. More specifically, an amorphous silicon film can be obtained easily by plasma decomposition of a silicon compound gas a a raw material gas and therefore such an amorphous silicon film is suited for making a solar cell have a large light receiving area. Furthermore, a photo CVD method using a low-pressure mercury lamp has also been utilized recently to develop an amorphous silicon solar cell.

In such a large area solar cell obtained by the plasma CVD method or the photo CVD method, a photoactive layer is in the form of a film and accordingly it is indispensably necessary to provide a substrate for supporting the photoactive layer. However, if the support surface of the substrate is a curved surface, it is difficult to obtain a photoactive layer having a uniform thickness and the optimum thickness for maximum photoelectric conversion efficiency cannot be obtained. In addition, even if a photoactive layer having a uniform thickness can be formed, it is extremely difficult in a photovoltaic device comprising such a photoactive layer to apply a desired fine patterning to an electrode film which electrically connect in series a plurality of photoelectric conversion elements as disclosed in U.S. Pat. No. 4,281,208, for example.

As a means for solving such difficulties, the prior art described in Japanese Utility Model Laying-Open Gazette No. 52640/1985 proposes a method in which a plurality of photoelectric conversion elements in the form of a film are formed in advance on a flat flexible substrate (a metal film of stainless steel, aluminium or the like) and the flexible substrate is adhered to the curved surface of the support plate making use of flexibility of the substrate.

However, if a flexible substrate is used as a supporting substrate for photoelectric conversion elements, its flexibility exerts, to the contrary, unfavorable influence on the manufacturing process, particularly the heating process, in which the final surface may be slightly curled due to a difference in the thermal expansion coefficient between the film of the photoelectric conversion elements and the flexible substrate formed on a flat surface or the photoelectric conversion elements might be broken because the flexible substrate is easily deformed by external pressure. In addition, if a photoactive layer is formed directly on the surface of a metal film, the photoelectric cells would be short-circuited, which would make it impossible to connect the photoelectric cells, and therefore, it is necessary to coat the surface of the metal film with an insulating film. However, if the thickness of the insulating film is not uniform or the insulating film contains pinholes or the like, the thickness of the photoactive layer also lacks uniformity and the photoelectric cells on the pinholes are short-circuited through the metal film, which causes the photoelectric conversion efficiency to be lowered and makes it impossible to connect the photoelectric cells. For the above described reasons, an insulating film is required to be formed in a manner in which it has a uniform thickness and does not contain pinholes, and accordingly, the manufacturing process becomes further complicated. Thus, a conventional photovoltaic device using a flexible substrate as a supporting substrate involves problems that the photoelectric conversion efficiency and other characteristics are not good in spite of a high manufacturing cost due to complication of the manufacturing process. Moreover, it is not suited for outdoor use, namely, it does not have good resistance to atmospheric conditions. Therefore, such a photovoltaic device cannot be put into practical use.

SUMMARY OF THE INVENTION

An object of the present invention is to provide a photovoltaic deice and a method of manufacturing the same in which photoelectric conversion elements are disposed on a curved surface of a transparent light receiving plate and a flexible substrate having various problems as described above is not used as a supporting substrate of the photoelectric conversion elements.

Briefly stated, the present invention is implemented in the following manner. A transparent supporting substrate (formed of a rigid material not easily bent) having flat surfaces parallel to each other is provided and film-shaped photoelectric conversion elements are formed on one of the flat surfaces. After that, the above stated supporting substrate is made to face, through an adhesive sheet, a curved surface of a transparent light receiving plate having a larger mechanical strength than that of the supporting substrate. Then, pressure is applied to the supporting substrate and the transparent light receiving plate oppositely so that the above stated supporting substrate is curved along the curved surface of the light receiving plate and adheres to this curved surface with the above stated adhesive sheet being interposed therebetween.

According to the present invention, a rigid material not easily bent is used as a supporting substrate, and compared with a conventional flexible substrate, the substrate of the present invention has better electric properties, weather resistance, manufacturing yield, manufacturing cost etc. In consequence, the present invention makes it possible to easily manufacture a photovoltaic device having a curved surface, which could not be easily be practically implemented in the prior art.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
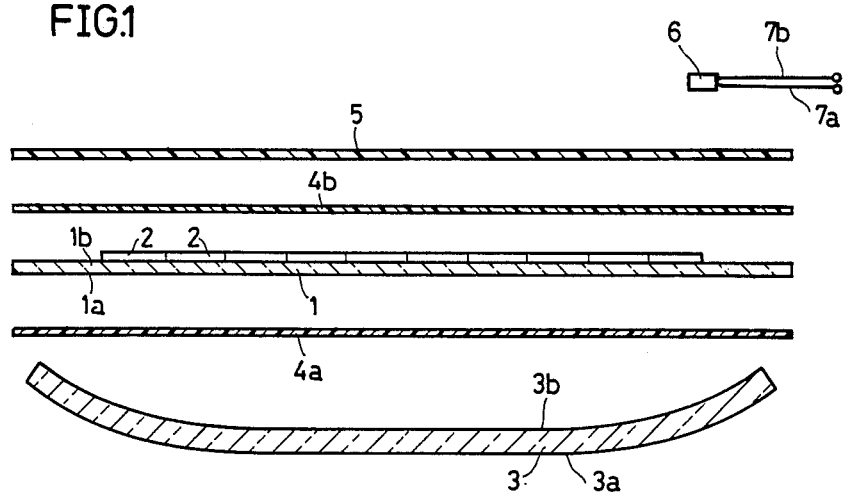
FIG. 1 is an exploded sectional view of an embodiment of the present invention.

Referring now to FIG. 1, a first embodiment will be described. A transparent glass substrate 1 has a first flat surface 1a and a second flat surface 1b parallel to each other and film-shaped photoelectric conversion elements 2 are formed in advance on the second surface 1b. This glass substrate 1 is of ordinary window glass (soda-lime glass) and has a thickness of approximately 0.2 mm to 2.0 mm for example. The transparent light receiving plate 3 is for example a sun roof or a moon roof for car including a first curved surface 3a and a second curved surface 3b over the whole area, each of the curved surfaces 3a and 3b having a radius of curvature of approximately 50 mm to $10^5$ mm and this transparent light receiving plate 3 has a plane area of approximately 40 cm to 90 cm $\times$ 80 cm to 180 cm. The second curved surface 3b of the light receiving plate 3 faces the first surface 1a of the glass substrate through an adhesive sheet 4a. The material and the thickness of the light receiving plate 3 are selected so that the mechanical strength thereof is larger than that of the glass substrate 1. For example, if this embodiment is applied to a sun roof or a moon roof for car, a plate of tempered glass, polycarbonate, acrylic or the like molded to have curved surfaces is used as the light receiving plate 3. Film 5 is a film for protecting the back surfaces of the photoelectric conversion elements 2 supported by the second surface 1b of the glass substrate 1 if the first curved surface 3a of the light receiving plate 3 is used as the light receiving surface, and as shown in FIG. 1, the protection film 5 faces the second surface 1b of the glass substrate 1 through an adhesive sheet 4b. A terminal box 6 serves to provide outputs of the photoelectric conversion elements 2, namely, the photovoltaic power to the exterior, the terminal box 6 comprising a pair of lead wires 7a and 7b.

Although the glass substrate 1 is used as the supporting substrate of the photoelectric conversion elements 2 in the above described embodiment, a transparent synthetic resin plate may be used instead of the glass substrate 1. In short, a transparent rigid material not easily bent is used as the supporting substrate.

Now, a method of manufacturing a photovoltaic device of the embodiment of the present invention structured as described above will be described. First, an adhesive sheet 4a is provided along the second curved surface 3b of the light receiving plate 3. Then, a glass substrate 1 on which photoelectric conversion elements 2 are formed in advance is placed on the second curved surface 3b of the light receiving plate 3. Since the glass substrate 1 does not have flexibility, the whole first surface 1a does not contact the adhesive sheet 4a and faces the second curved surface 3b of the light receiving plate 3 such that a gap is formed according to the curvature of the light receiving plate 3. Then, an adhesive sheet 4b and a protection film 5 are placed successively on the second surface 1b of the glass substrate 1 so that the terminal box 6 is electrically connected with the photoelectric conversion elements 2.

Figure 2:
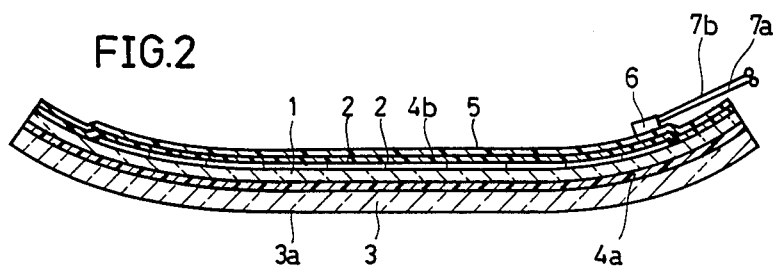
FIG. 2 is a sectional view of an embodiment of the present invention.

After the electric connection is thus completed, the above described laminated structure is put in a flexible bag and the air in the bag is exhausted from the opening thereof so that the interior of the bag is kept under a reduced pressure of 10 Torr or less. As the exhaust of air proceeds, the interior of the bag is compressed by atmospheric pressure from the outside and accordingly the glass substrate 1 having low mechanical strength is curved to reduce the gap formed between the light receiving plate 3 and the second curved surface 3b so that the first surface 1a of the glass substrate 1 finally adheres to the second curved surface 3b of the light receiving plate 3 through the adhesive sheet 4a. In the same manner, the protection film 5 is made to adhere on the photoelectric conversion elements 2 through the adhesive sheet 4b. The above described state is shown in FIG. 2.

In this case, if the above stated adhesive sheets 4a and 4b have adhesive properties at room temperature, it is only necessary to contact the light receiving plate 3, the glass substrate 1 and the protection film 5 by means of pressure. However, if polyvinyl butyral (PVB) or ethylene vinyl acetate (EVA) having almost the same refractive index as the light receiving plate 3 and the glass substrate 1 is used as the adhesive sheets 4a and 4b, a heating process is applied. Sheets of such PVB and EVA having a thickness of approximately 0.1 mm to several millimeters are sold by the Du Pont Co. of USA for example. Such sheets of PVB and EVA are opaque (white) at the time of purchase thereof. However, if a heating process at approximately 100° C. to 150° C. is applied for about 5 minutes to 20 minutes with a reduced pressure of 10 Torr or less being kept as described above, the sheets of PVB or EVA are subjected to melting and removal of air, and when they are cooled after that, the light receiving plate 3, the glass substrate 1 and the protection film 5 as described above are joined integrally as a unitary structure through the now transparent adhesive sheets 4a and 4b of PVB or EVA.

The above described pressure reduction process may be applied in a pressurized container. In this case, as compared with the case in which the pressure reduction process is applied in the atmosphere, the pressure applied to the glass substrate 1 and the light receiving plate 3 becomes large, which makes the adhesion between the glass substrate 1 and the protection film 5 more stable.

Instead of the adhesion process utilizing atmospheric pressure as described above, adhesion between the light receiving plate 3, the glass substrate 1 and the protection film 5 may be effected by a pressing process using a female metallic mold adapted to the first curved surface 3a of the light receiving plate 3 and a male metallic mold adapted to the second curved surface 3b thereof.

Figure 3:
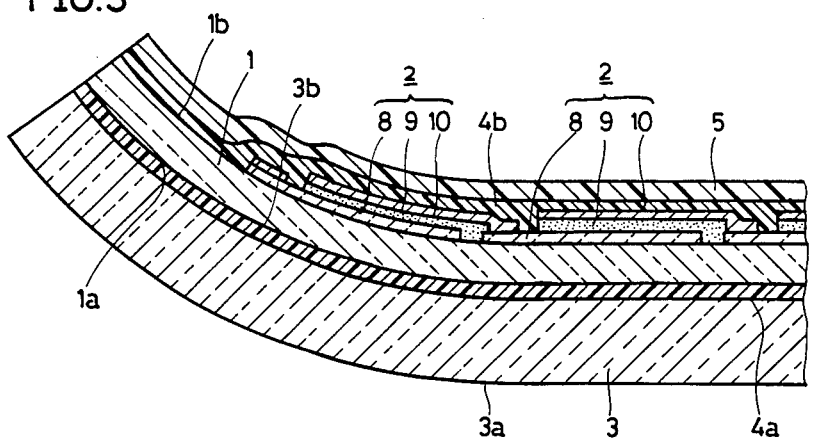
FIG. 3 is a partial enlarged sectional view of an embodiment of the present invention.

A preferred embodiment of the photoelectric conversion elements 2 in the above described embodiment will be shown in FIG. 3 in an enlarged manner. More specifically, each photoelectric conversion element 2 comprises, successively from the second surface 1b of the glass substrate 1, a first electrode film 8 of transparent conductive oxide (TCO) such as tin oxide or indium tin oxide; a semiconductor photoactive layer 9 of amorphous silicon formed by a plasma CVD method or a photo CVD method using a silicon compound gas as a raw material gas, a semiconductor junction parallel to the film surface being formed in the semiconductor photoactive layer 9; and a second electrode film 10 of aluminum or silver, or a two layer laminate of TCO and silver. These photoelectric conversion elements 2 are arrayed at predetermined intervals and the first electrode film 8 of one of the respective adjacent photoelectric conversion elements is electrically connected with the second electrode film 10 of the other one of the respective adjacent photoelectric elements in each spacing region. In other words, a plurality of photoelectric conversion elements 2 are connected in series as described in U.S. Pat. No. 4,281,208.

Figure 4:
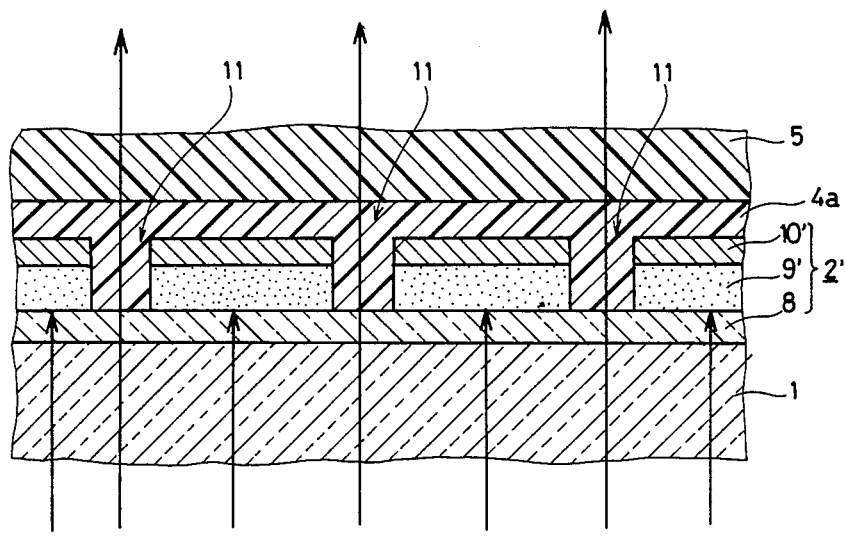
FIG. 4 is a view showing a sectional structure of a portion of another embodiment of the present invention.
Figure 5:
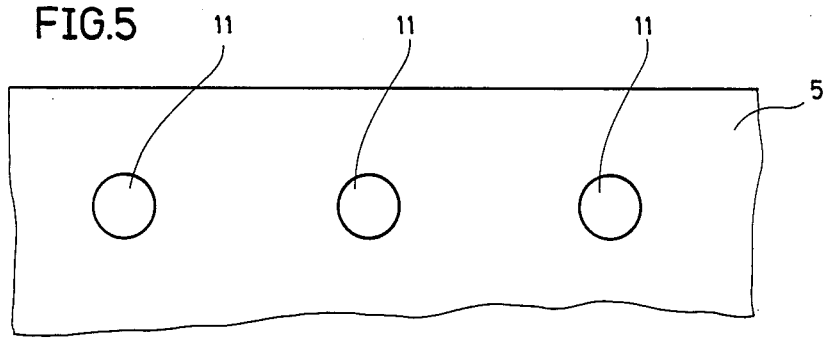
FIG. 5 is a plan view of the embodiment shown in FIG. 4.

In the above described embodiment, the photoelectric conversion elements 2 are formed substantially without any gaps on the glass substrate 1 and since the photoactive layer portions 9 and the second electrode film portions 10 do not transmit light, the photovoltaic device in the above described embodiment hardly transmits light. However, if such a photovoltaic device is used with a sun roof or a moon roof of a car, it is sometimes desired to transmit some amount of light. FIGS. 4 and 5 are views showing another embodiment of the present invention which can satisfy such a requirement. Particularly, FIG. 4 shows a portion of the sectional structure of the embodiment and FIG. 5 shows a plan view of the embodiment. In the following, this embodiment of the present invention will be described with reference to FIGS. 4 and 5.

The embodiment shown in FIGS. 4 and 5 is the same as the embodiment shown in FIGS. 1 to 3 except for the below described feature, and therefore, the corresponding portions will be indicated by the same reference numerals and description thereof will be omitted. The characteristic feature of the embodiment shown in FIGS. 4 and 5 is that an array of holes 11 is formed in each photoelectric conversion element 2 comprising a first electrode film 8, a photoactive layer 9 and a second electrode film 10. These holes 11 serve as light transmitting portions. In such an arrangement, the light incident on the glass substrate 1 is applied to the photoactive layer portions 9 where it is photoelectrically converted and at the same time a part of the incident light passes through the light transmitting portions 11 to penetrate the back surface of the protection film 5. Consequently, if a photovoltaic device of this embodiment is used for a sun roof or a moon roof of a car, a part of the external light enters inside the car. However, most of the external light is intercepted by the photoelectric conversion elements 2, and accordingly, direct sunlight does not enter inside the car and extremely comfortable lighting can be realized. By suitably increasing or decreasing the areas or the numbers of the light transmitting portions 11, the amount of transmitted light can be set to a desired value.

In FIG. 5, the form of each light transmitting portion 11 is circular. However, the form of the light transmitting portions 11 is not limited to such a circular form and any other form may be adopted.

Each of the light transmitting portions 11 has an extremely small area and they are arranged at uniform intervals and close to each other over the whole area of the glass substrate 1. Therefore, a person inside the car provided with such a photovoltaic device will not be able to distinguish the light transmitting portions 11 from the other portions and will feel as if light were coming uniformly from the whole surface of the photovoltaic device. Accordingly, a person inside the car is able to get a clear view of the outside through the photovoltaic device and can enjoy the outside landscape.

The above described embodiments can be applied not only to a sun roof or a moon roof of a car but also to a side window or a rear window of a car, or window panes of a building. In addition, the above described embodiments are also applicable to roof tiles.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising:
   a curved and transparent light receiving plate,
   a transparent supporting substrate, one surface thereof adhered to one curved surface of said light receiving plate through an adhesive sheet, and
   a plurality of film-shaped photoelectric conversion elements formed on the other surface of said supporting substrate,
   said supporting substrate being formed of a rigid material not easily curved,
   said photoelectric conversion elements being formed in advance on said other surface of said supporting substrate in a flat shape prior to adhesion of said supporting substrate to said light receiving plate, pressure being applied to said flat-shaped supporting substrate and said light receiving plate oppositely so that said supporting substrate is curved along one curved surface of said light receiving plate, whereby said supporting substrate adheres to said curved surface of said light receiving plate.

2. A photovoltaic device in accordance with claim 1, wherein
   said supporting substrate is a glass plate.

3. A photovoltaic device in accordance with claim 1, wherein
   said supporting substrate is a transparent synthetic resin plate.

4. A photovoltaic device in accordance with claim 1, wherein
   said light receiving plate is a tempered glass plate.

5. A photovoltaic device in accordance with claim 1, wherein
   said light receiving plate is a transparent synthetic resin plate.

6. A photovoltaic device in accordance with claim 1, wherein
   said respective photoelectric conversion elements are provided with holes serving as light transmitting portions,
   part of the light incident on said light receiving plate passes through said holes.

7. A method of manufacturing a photovoltaic device comprising:
   a first step of providing a transparent supporting substrate having flat surfaces parallel to each other, and formed of a rigid material not easily curved, a second step of forming a plurality of film-shaped photoelectric conversion elements on one of the flat surfaces of said supporting substrate, a third step of providing a transparent light receiving plate of a curved shape having a larger mechanical strength than that of said supporting substrate, a fourth step of making the other flat surface of said supporting substrate face one curved surface of said light receiving plate through an adhesive sheet, and a fifth step of applying pressure to opposite sides of said supporting substrate and said light receiving plate so that said supporting substrate is curved along said curved surface of said light receiving plate and adheres to said curved surface.

8. A method of manufacturing a photovoltaic device in accordance with claim 7, wherein said fifth step comprises a pressure reduction step of removing the air in a gap formed between said other flat surface of said supporting substrate and said one curved surface of said light receiving plate when they face each other, so that atmospheric pressure is applied to said supporting substrate and said light receiving plate from opposite directions.

9. A method of manufacturing a photovoltaic device in accordance with claim 8, wherein said pressure reduction step is applied in a pressurized container.

10. A method of manufacturing a photovoltaic device in accordance with claim 7, wherein said fifth step of applying pressure by a pressing process using metallic molds adapted to the curved surfaces of said light receiving plate.

* * * * *